(12) United States Patent
Sugita (10) Patent No.: US 9,791,516 B2
(45) Date of Patent: Oct. 17, 2017

(54) INSPECTION METHOD OF FUEL BATTERY

(71) Applicant: TOYOTA JIDOSHA KABUSHIKI KAISHA, Toyota-shi, Aichi-ken (JP)

(72) Inventor: Kazumi Sugita, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/948,872

(22) Filed: Nov. 23, 2015

(65) Prior Publication Data

US 2016/0154062 A1    Jun. 2, 2016

(30) Foreign Application Priority Data

Nov. 27, 2014   (JP) .................................. 2014-240133

(51) Int. Cl.
    *G01N 27/416*   (2006.01)
    *H01M 8/06*     (2016.01)
    *G01R 31/36*    (2006.01)

(52) U.S. Cl.
    CPC ........ *G01R 31/3641* (2013.01); *G01R 31/362* (2013.01); *G01R 31/3606* (2013.01)

(58) Field of Classification Search
    CPC ............ G01R 31/3641; G01R 31/3606; G01R 31/362
    See application file for complete search history.

(56) References Cited

U.S. PATENT DOCUMENTS

| | | | | |
|---|---|---|---|---|
| 5,760,488 A | * | 6/1998 | Sonntag ................ | B60L 3/0069 180/65.1 |
| 2005/0202292 A1 | * | 9/2005 | Richards ............ | H01M 8/04089 429/429 |
| 2010/0287126 A1 | * | 11/2010 | Kawase ............ | H01M 8/04089 706/12 |
| 2011/0316549 A1 | * | 12/2011 | Coenen ................ | G01R 31/026 324/434 |
| 2015/0017563 A1 | | 1/2015 | Shirakawa et al. | |

FOREIGN PATENT DOCUMENTS

| | | |
|---|---|---|
| JP | 02-021573 A | 1/1990 |
| JP | 2012-520996 A | 9/2012 |
| JP | 2013-180643 | 9/2013 |
| WO | WO 2010/106141 A1 | 9/2010 |

\* cited by examiner

*Primary Examiner* — Farhana Hoque
(74) *Attorney, Agent, or Firm* — Finnegan, Henderson, Farabow, Garrett & Dunner, LLP (57) ABSTRACT

An inspection method of a fuel battery by using an electrical charge existing in a fuel battery stack includes a supplying step in which the electrical charge is supplied from an external power supply to the fuel battery stack.

8 Claims, 9 Drawing Sheets

INSPECTION METHOD OF FUEL BATTERY

INCORPORATION BY REFERENCE

The disclosure of Japanese Patent Application No. 2014-240133 filed on Nov. 27, 2014 including the specification, drawings and abstract is incorporated herein by reference in its entirety.

BACKGROUND OF THE INVENTION

1. Field of the Invention

The invention relates to a method for inspecting a fuel battery without actually generating electric power by supplying fuel gas.

2. Description of Related Art

A fuel battery has a fuel battery stack in which plural fuel battery cells are stacked. The fuel battery stack includes a cell monitor for monitoring a state of each fuel battery cell. The each fuel battery cell and the cell monitor are connected by a connector cable.

Conventionally, a connection inspection method of the connector cable of the cell monitor is conducted by actually supplying fuel gas to the fuel battery stack to generate a battery reaction. The each fuel battery cell carries an electrical charge by generation of the battery reaction, and the electrical charge is received as a voltage signal from a cell monitor substrate. In this way, it is confirmed that there is no problem with the connection of the connector cable.

As a technique related to the fuel battery including the cell monitor, for example, a fuel battery unit that includes: a fuel battery having plural stacked fuel battery cells; and a cell monitor for monitoring a state of the each fuel battery cell, and in which the cell monitor is arranged in a side region of the fuel battery has been disclosed (see Japanese Patent Application Publication No. 2013-180643 (JP 2013-180643 A)).

By the way, in a conventional inspection method of a finished product of the fuel battery, oxidation gas (air, oxygen: $O_2$) and hydrogen ($H_2$) as the fuel gas needs to be supplied through the fuel battery stack. Thus, the inspection cannot be conducted until the fuel battery is connected to a fuel gas supply device and is brought into a state that the fuel gas can be supplied to the fuel battery.

In addition, inspection of the fuel battery in a manufacturing process of the fuel battery has not been considered. If it is assumed that the inspection is conducted in the manufacturing process of the fuel battery, an assumable method would be to measure electric insulation resistance of an exterior part. Since it is assumed that hydrogen and oxygen are supplied to the fuel battery stack to actually generate electric power in the inspection of an electric insulation property of this exterior part, the fuel gas supply device needs to be connected to the battery. Thus, inspection facility becomes large and complicated, and a difficulty in terms of the facility is expected in conducting an inspection by actually generating the electric power in the fuel battery stack. In fact, the subject applicant could not find literature that has been known publically and describes an inspection method conducted by actually generating the electric power in the manufacturing process.

SUMMARY OF THE INVENTION

The invention has been created in view of the above circumstance and provides an inspection method of a fuel battery in which the fuel battery can easily be inspected without actually generating electric power by supplying fuel gas to a fuel battery stack not only in a finished product of the fuel battery but also in the fuel battery in a manufacturing process.

An aspect of the invention is an inspection method of a fuel battery by using an electrical charge existing in a fuel battery stack including a supplying step of supplying the electrical charge from an external power supply to the fuel battery stack.

In the aspect of the invention, the fuel battery may include an main-positive section that is provided to a positive terminal of the fuel battery stack and an main-negative section that is provided to a negative terminal of the fuel battery stack, and the supplying step may include applying the electrical charge to either the main-positive section or the main-negative section.

In the aspect of the invention, fuel battery cells that constitute the fuel battery stack may be each connected to a cell monitor. The aspect of the invention may include a determining step of determining whether a connection between each of the fuel battery cells and the cell monitor is normal based on a value of the cell monitor, after the supplying step.

In the aspect of the invention, the determining step may be conducted before supplying devices that supply hydrogen gas and oxidation gas as fuel gas to the fuel battery are connected to the fuel battery stack.

In the aspect of the invention, the cell monitor may be configured to detect a voltage of each of the fuel battery cells and to send a detected voltage to an inspection facility outside the fuel battery stack. The inspection facility may be configured to perform the determining step.

The aspect of the invention may include a first detecting step of detecting, by the cell monitor, a voltage of each of the fuel battery cell before the supplying step and a second detecting step of detecting, by the cell monitor, the voltage of each of the fuel battery cell after the supplying step. The determining step may be performed based on a difference between a voltage detected in the first detecting step and a voltage detected in the second detecting step.

The aspect of the invention may include an inspecting step of inspecting an electric insulation property of an exterior part of the fuel battery stack based on a leak current from the exterior part after the electrical charge is supplied.

In the inspection method of the fuel battery according to the aspect of the invention, the inspection is conducted by applying the electrical charge from the external power supply without actually generating electric power by supplying fuel gas to the fuel battery stack not only in a finished product of the fuel battery but also in the fuel battery in a manufacturing process. Thus, compared to a case of actually generating the electric power, the fuel battery can easily be inspected.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A description will hereinafter be made on embodiments of the invention. In the following description of the drawings, the same or similar components are denoted by the same or similar reference numerals. It should be noted that the drawings are merely schematic. Thus, specific dimensions and the like should be determined by referring to the following description. Needless to say, dimensional relationships or ratios of components may differ among the drawings.

Terms are defined in this specification as follows. An "inspection" refers to determination of abnormality of an inspection target by comparing a state in which the inspection target should be in a normal time and an actual state in an electric power generating state of the inspection target. The electric power generating state includes a state where the inspection target is brought into the same internal state as a state where the inspection target actually generates the electric power, by being supplied with an electrical charge from an external part, in addition to a state where the inspection target actually generates the electric power. A "manufacturing process" refers to a process before the inspection target is finally completed as a product, and is a process before supply means of hydrogen gas and oxidation gas as fuel gas is connected to a fuel battery stack in a case of a fuel battery system.

Figure 1:
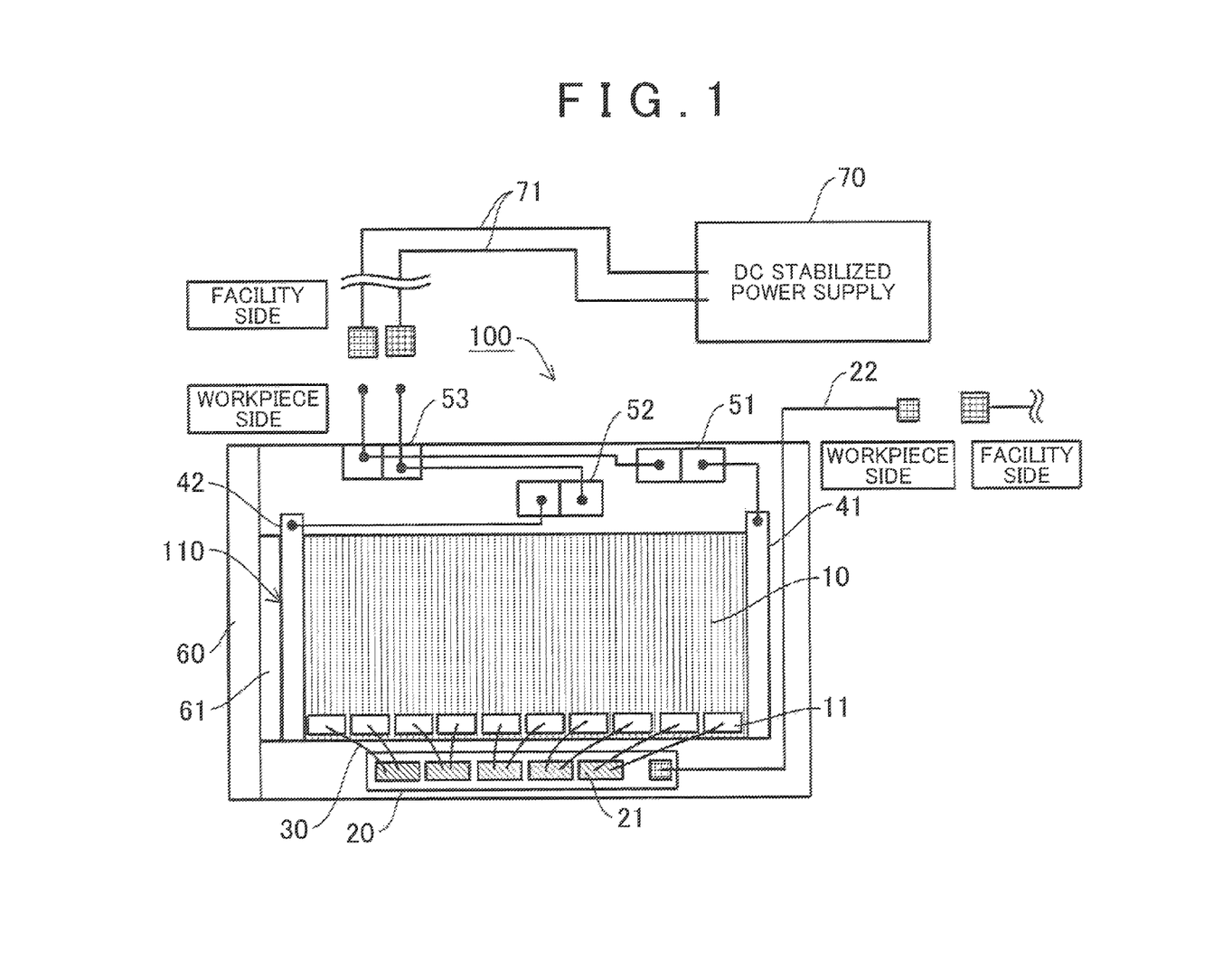
FIG. 1 is a schematic view of an inspection target and inspection facility for an inspection method of a fuel battery according to a first embodiment of the invention.

First, a description will be made on an inspection target and inspection facility of an inspection method of a fuel battery according to a first embodiment of the invention with reference to FIG. 1. FIG. 1 is a schematic view of the inspection target and an inspection situation of the inspection method of the fuel battery according to the first embodiment of the invention.

As shown in FIG. 1, a fuel battery 100 has a fuel battery stack 110 in which plural fuel battery cells 10 are stacked. The plural fuel battery cells 10 each has a structure of holding a stacked body, in which gas diffusion electrodes are stacked on both sides of a polymer electrolyte film, between a pair of separators, and the plural fuel battery cells are stacked and fastened in series.

The each fuel battery cell 10 includes a connection terminal 11. A cell monitor 20 that is a vehicle electric control unit (ECU) for monitoring a state of the each fuel battery cell 10 is provided on a side surface of the fuel battery 100. The cell monitor 20 includes plural connection terminals 21. The connection terminal 11 of the each fuel battery cell 10 and the connection terminal 21 of the cell monitor 20 are connected by a connector cable 30. The inspection target of the inspection method of the fuel battery according to the first embodiment is connection between the each fuel battery cell 10 and the cell monitor 20.

An main-positive terminal (an main-positive section) 41 and an main-negative terminal (an main-negative section) 42 are provided at positive terminal and negative terminal of the fuel battery stack 110, respectively. The main-positive terminal 41 is electrically connected to a terminal board 53 via an main-positive relay 51. Meanwhile, the main-negative terminal 42 is electrically connected to the terminal board 53 via an main-negative relay 52.

The fuel battery 100 of this embodiment includes a DC stabilized power supply 70 in a detachable manner that is an external power supply for supplying the electrical charge (applying voltage) to the fuel battery stack 110 during an inspection. A connection cable 71 of the DC stabilized power supply 70 is electrically connected to the terminal board 53 during the inspection. In addition, a communication cable 22 for sending a signal is electrically connected to the cell monitor 20. The communication cable 22 is electrically connected to the inspection facility, which is not shown. The cell monitor 20 digitizes a measured value and sends the value to the inspection facility.

Figure 3:
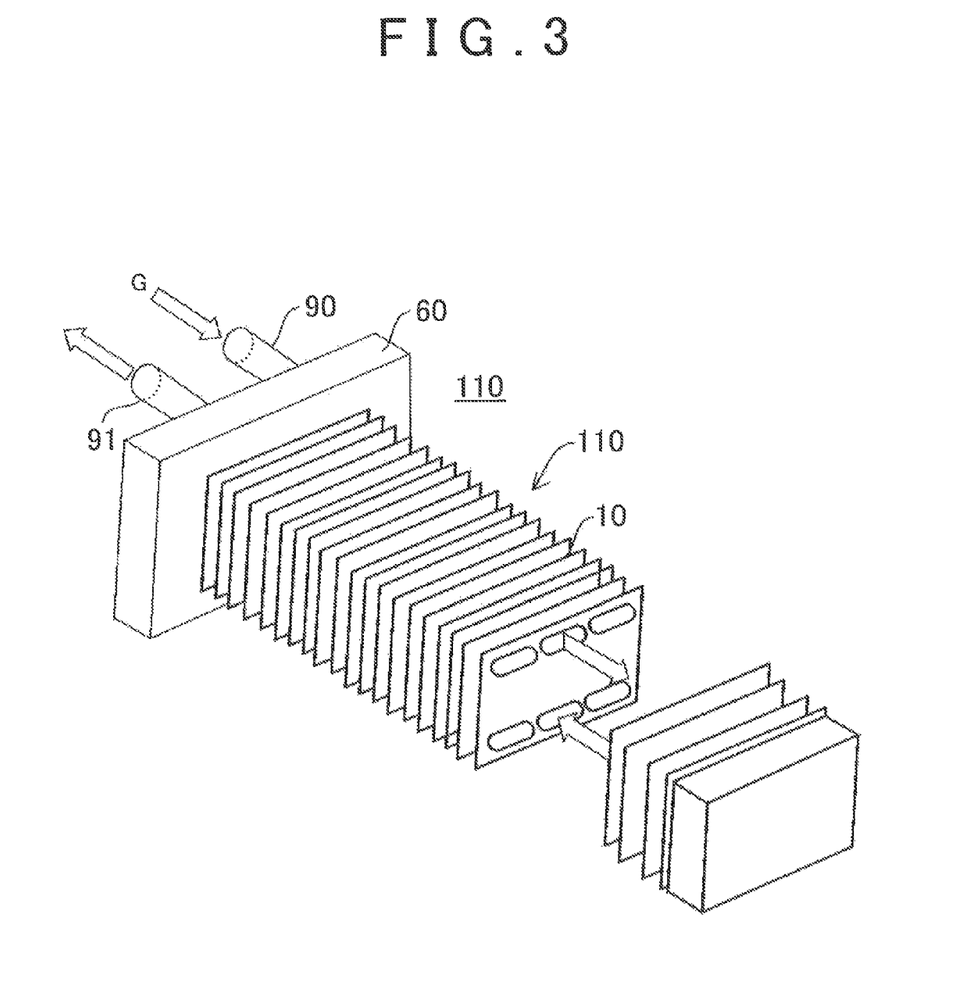
FIG. 3 is a schematic view for explaining a situation where fuel gas is supplied from a fuel gas supply device to the fuel battery as a comparative example.

It should be noted that, in the fuel battery 100, a fuel supply/discharge section 60 that includes a fuel supply pipe 90 and a fuel discharge pipe 91 as a portion of a fuel gas supply device (not shown) is connected to an end of the fuel battery 100 in a latter half of the manufacturing process or after shipment (see FIG. 3). A fuel distribution end plate 61 is interposed between the fuel supply/discharge section 60 and the main-negative terminal 42. It should be noted that the fuel supply pipe and the fuel discharge pipe are not connected in the manufacturing process before connection of the fuel gas supply device.

Figure 2A:
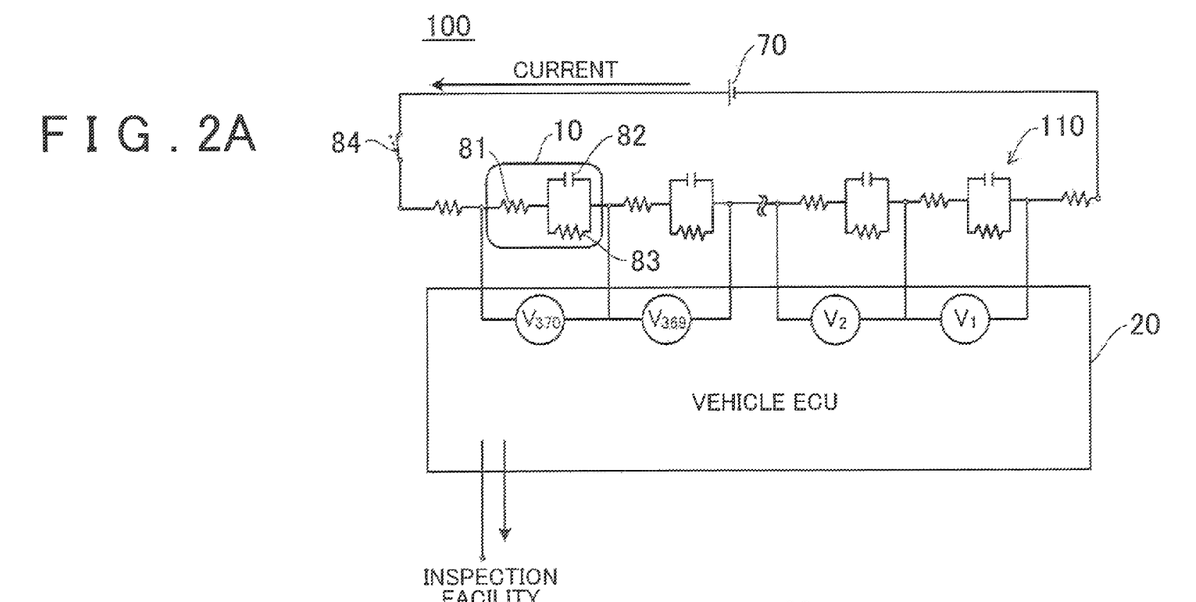
FIG. 2A and FIG. 2B are schematic views of an energized state of a fuel battery stack of the first embodiment.
Figure 2B:
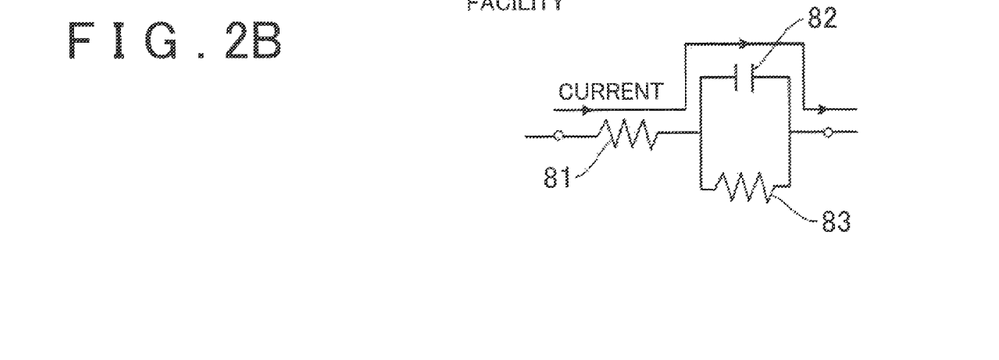
Figure 4:
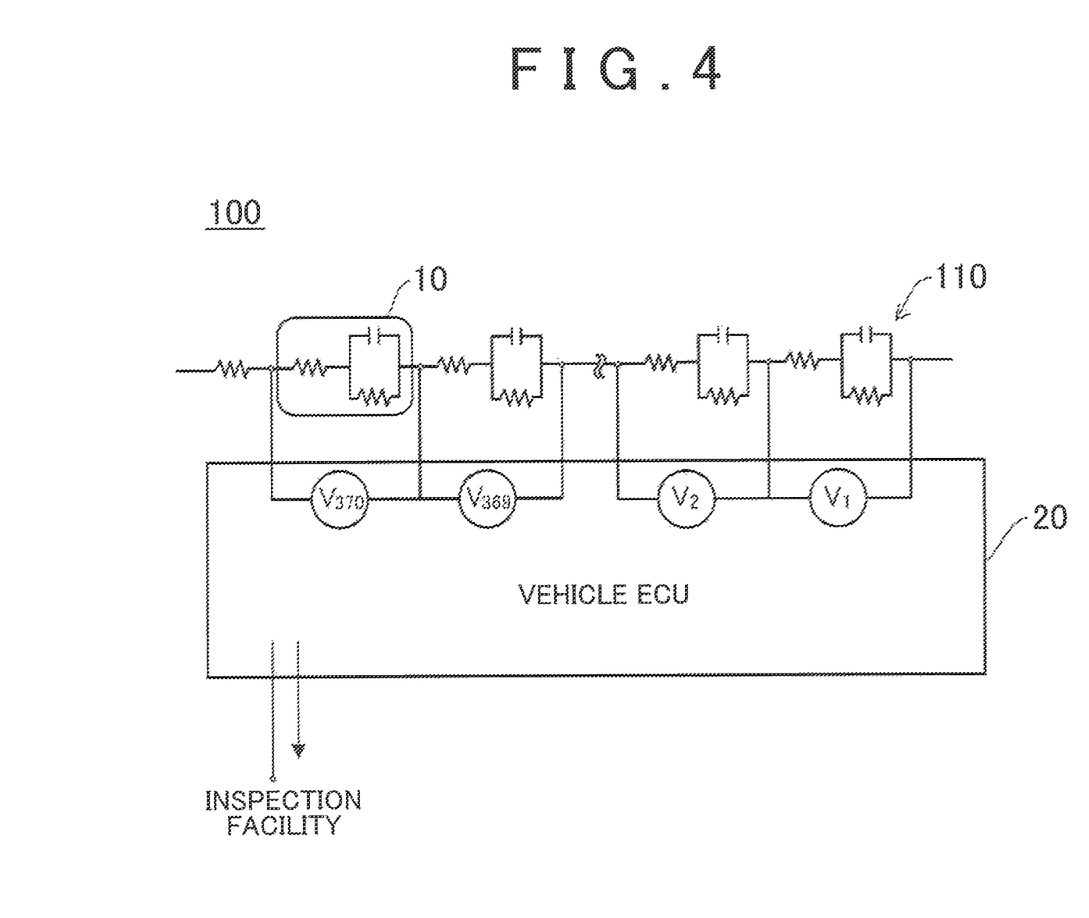
FIG. 4 is an explanatory view of a cell monitor connection inspection method of the fuel battery as a comparative example that is conducted by supplying the fuel gas from the fuel gas supply device to the fuel battery.
Figure 5:
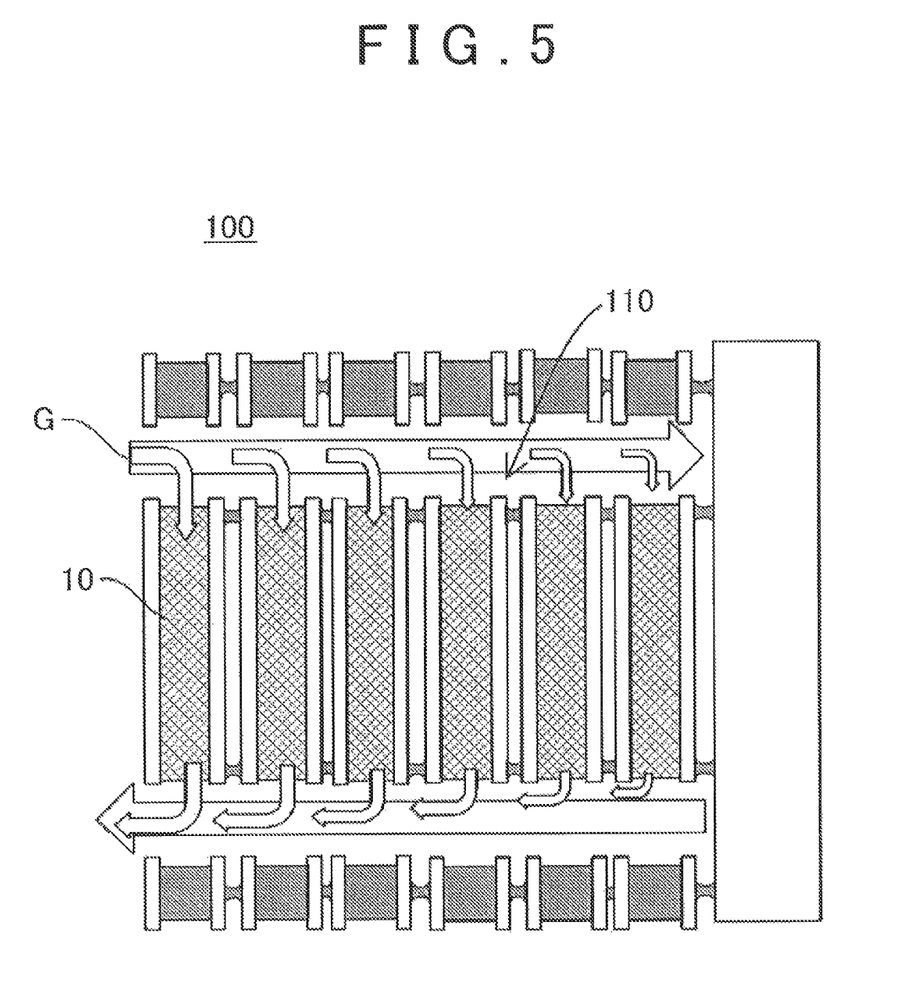
FIG. 5 is a schematic view provided to explain a problem that occurs when the fuel gas is supplied from the fuel gas supply device to the fuel battery.

Next, a description will be made on the inspection method of the fuel battery according to the first embodiment of the invention with reference to FIG. 1 to FIG. 5. FIG. 2A and FIG. 2B are schematic views of an energized state of the fuel battery stack of the first embodiment. FIG. 3 is a schematic view for explaining a situation where the fuel gas is supplied from the fuel gas supply device to the fuel battery as the inspection method of the fuel battery in a comparative example. FIG. 4 is an explanatory view of a cell monitor connection inspection method of the fuel battery as the inspection method of the fuel battery as a comparative example that is conducted by supplying the fuel gas from the fuel gas supply device to the fuel battery. FIG. 5 is a schematic view provided to explain a problem that occurs when the fuel gas is supplied from the fuel gas supply device to the fuel battery.

In the first embodiment, the cell monitor connection inspection method will be described as the inspection method of the fuel battery. The cell monitor connection inspection method of the first embodiment includes: a process of supplying the electrical charge from the external power supply to the fuel battery stack; and a process of determining the connection between the each fuel battery cell and the cell monitor on the basis of a value of the cell monitor after the electrical charge supply process.

As shown in FIG. 1, in the process of supplying the electrical charge from the external power supply to the fuel battery stack, the connection cable 71 of the DC stabilized power supply 70 as the external power supply is electrically connected to the terminal board 53. Then, the electrical charge is supplied (the voltage is applied) from the DC stabilized power supply 70 to the fuel battery stack 110 so as to make the current flow through the fuel battery stack 110.

As shown in FIG. 2A and FIG. 2B, in the fuel battery 100, the fuel battery cell 10 includes contact resistance 81 and an electric double-layer capacity 82 as an electrically equivalent circuit. The electric double-layer capacity 82 is a capacitor that is formed between a pair of the gas diffusion electrodes that hold the electrolyte film therebetween. A switch 84 schematically shows electrically connecting means by the main-positive relay 51 and the main-negative relay 52. In the case where the DC stabilized power supply 70 is connected to the terminal board 53, the main-positive relay 51 and the main-negative relay 52 are short-circuited, that is, the switch 84 is brought into a connected state, and the current flows through the fuel battery stack 110 in a state that the fuel gas is not supplied to the fuel battery stack 110, the current passes through the contact resistance 81 and the electric double-layer capacity 82, and thus the each fuel battery cell 10 does not form a battery. In general, only ions (protons in a case of a polymer electrolyte fuel cell (PEFC)) pass through the electrolyte film in the fuel battery cell 10. However, at this time, a crossover of the fuel gas or electrons always occurs. Accordingly, electrical charge transfer resistance 83 is generated equivalently in parallel with the electric double-layer capacity 82 in the fuel battery cell 10. Thus, in the case where the voltage is applied to the fuel battery stack 110, the constant current that is determined by the contact resistance 81 and the electrical charge transfer resistance 83 flows through the each fuel battery cell 10. The voltage at both ends of the fuel battery cell 10 that is determined by this contact resistance 81, the electrical charge transfer resistance 83, and the current is detected by the cell monitor 20. In this way, a connection state of the cell monitor can be inspected.

It should be noted that, in the case where fuel gas G is actually supplied to the fuel battery 100 as shown in FIG. 3 and FIG. 4 as a comparative example, each of the fuel battery cells 10 forms a battery and stores the electrical charge. In the cell monitor connection inspection method of the comparative example that is conducted by supplying the fuel gas, the cell monitor 20 detects an output voltage that is generated by electric power generation in the each fuel battery cell 10 in a state that the fuel gas G is supplied. However, in the case where the fuel gas supply device needs to be disconnected later, nitrogen (N$_2$) purging needs to be conducted after the inspection to replace the fuel gas with nitrogen. Thus, the facility is complicated, and productivity is possibly extremely lowered. In addition, a person cannot touch the fuel battery stack 110 in a state with the stored electrical charge. Thus, the electrical charge needs to be consumed by self-discharge, which resulted in occurrence of a waiting time. Furthermore, even when an electric power generation inspection bench is used, the bench is used to inspect a component that will be assembled later. Thus, the process for the connection inspection is possibly complicated.

Next, a description will be made on a process of determining the connection state of the cell monitor with reference to FIG. 1, FIG. 2A and FIG. 2B again. In the process of determining the connection state of the cell monitor, the cell monitor 20 measures the voltage of the each fuel battery cell 10 in the fuel battery stack 110 after the electrical charge supply process. The cell monitor 20 digitizes the measured voltage, and sends a signal to the inspection facility, which is not shown. The inspection facility reviews a numerical value that has been digitized. When the connection between the fuel battery cell 10 and the cell monitor 20 is poor, the voltage is not applied to the cell monitor 20, and thus the voltage to be detected by the cell monitor 20 is not detected. On the other hand, when the connection between the fuel battery cell 10 and the cell monitor 20 is normal, the divided voltage of the each fuel battery cell 10, which is determined by the applied voltage from the DC stabilized power supply 70 and the number of stacks of the fuel battery cells 10 for constituting the fuel battery stack 110, should be applied to the cell monitor 20. In the above circumstance, for example, when the voltage detected by the cell monitor 20 is 0 V, it can be determined that the connector cable 30 for connecting the fuel battery cell 10 and the cell monitor 20 is not connected. In addition, when the voltage detected by the cell monitor 20 is the above divided voltage, for example, 100 mV±40 mV as an exemplary determination standard, it can be determined that the connection of the connector cable 30 is fine.

On the contrary, in the cell monitor connection inspection method of the comparative example shown in FIG. 3 and FIG. 4, the inspection needs to be conducted by actually causing the each fuel battery cell to generate the electric power, so as to determine whether the fuel battery stack or the each fuel battery cell as a single unit is a fine product. Thus, the following problems occur. That is, as shown in FIG. 3 and FIG. 5, the fuel gas G is less likely to be delivered to the fuel battery cells 10 that are away from the fuel supply pipe 90 of the fuel battery stack 110. Even when the process of removing the fuel gas G through the nitrogen (N$_2$) purging is conducted, the fuel gas G possibly remains in the fuel battery stack 110. In addition, since some of the fuel battery cells 10 store the electrical charge at an early stage, it is possibly determined that the connection is OK even in an unconnected state.

Here, a description will be made on a case where the cell monitor connection inspection method of this embodiment is conducted after the electric power generation inspection that is conducted by supplying the fuel gas from the fuel gas supply device. As described above, the cell monitor connection inspection method of this embodiment is an inspection method in which the crossover of the electrolyte film of the fuel battery is used. Thus, likeliness of the electrons to move changes depending on a wet state of the electrolyte film, and as a result, the electrical charge transfer resistance 83 changes. In addition, as described above, the electrical charge transfer resistance 83 also changes depending on an unoperated time after the conduction of the electric power generation inspection or the like. For this reason, the above determination standard cannot be provided as in the case where the cell monitor connection inspection method is conducted prior to the conduction of the electric power generation inspection. Thus, in the case where the cell monitor connection inspection method is conducted after the conduction of the electric power generation inspection, an initial voltage value of the each fuel battery cell 10 is first measured by the cell monitor 20 in a state that the voltage is not applied from the external part, that is, in a state before the DC stabilized power supply 70 is connected or the switch 84 is blocked. Then, the voltage value of the each fuel battery cell 10 is measured by the cell monitor 20 in a state that the voltage is applied from the external part, that is, in a state that the DC stabilized power supply 70 is connected or the switch 84 is in the connection state. Thereafter, a difference between the voltage value detected by the cell monitor 20 and the initial voltage value is computed, and the connection state of the cell monitor is determined on the basis of whether said difference matches the above-described determination standard value. An influence of external disturbance is compensated by computing the difference between the initial voltage value in the state that the voltage is not applied and an inspection voltage value in the state that the voltage is applied, and the appropriate inspection of the connection state of the cell monitor can be conducted.

In other words, in the cell monitor connection inspection method according to this embodiment, the voltage is applied from the external part to the fuel battery stack 110, and the signal of the cell monitor 20 is checked. In the case where the cell monitor 20 detects 0 V regardless of a fact that the voltage is applied to the fuel battery stack 110, it is determined that the connection of the cell monitor 20 is poor. In addition, in the case where the cell monitor 20 indicates a predetermined standard value that is set in advance, it is determined that the connection is normal. Thus, even after the electric power generation inspection of the fuel battery cell 10 as the single unit that is conducted by actually supplying the fuel gas to the fuel battery stack 110, the connection failure of the cell monitor 20 can be determined from the detected voltage value of the cell monitor 20.

As it has been described so far, the inspection method of the fuel battery according to the first embodiment is the inspection method of the connection state between the each fuel battery cell 10 for constituting the fuel battery stack 110 and the cell monitor 20. According to the cell monitor connection inspection method of this embodiment, such a superior effect is exhibited that the connection state between the each fuel battery cell 10 and the cell monitor 20 can be inspected without actually generating the electric power by supplying the fuel gas to the fuel battery stack 110 not only in the finished product of the fuel battery 100 but also in the fuel battery 100 in the manufacturing process.

Figure 6A:
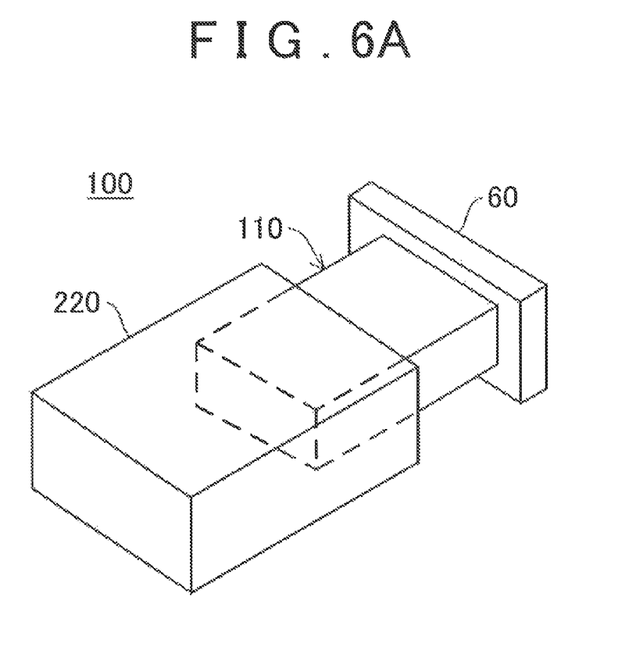
FIG. 6A and FIG. 6B are schematic views of a fuel battery of a second embodiment.
Figure 6B:
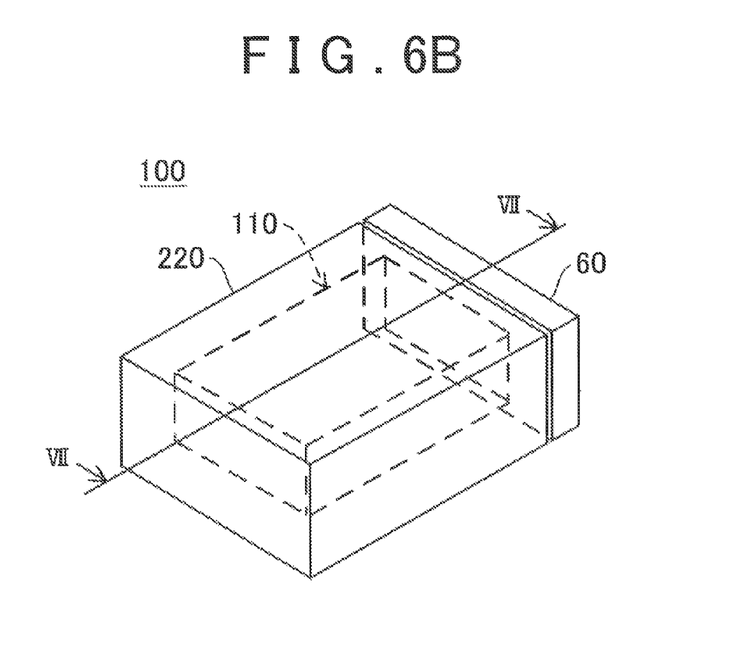
Figure 7:
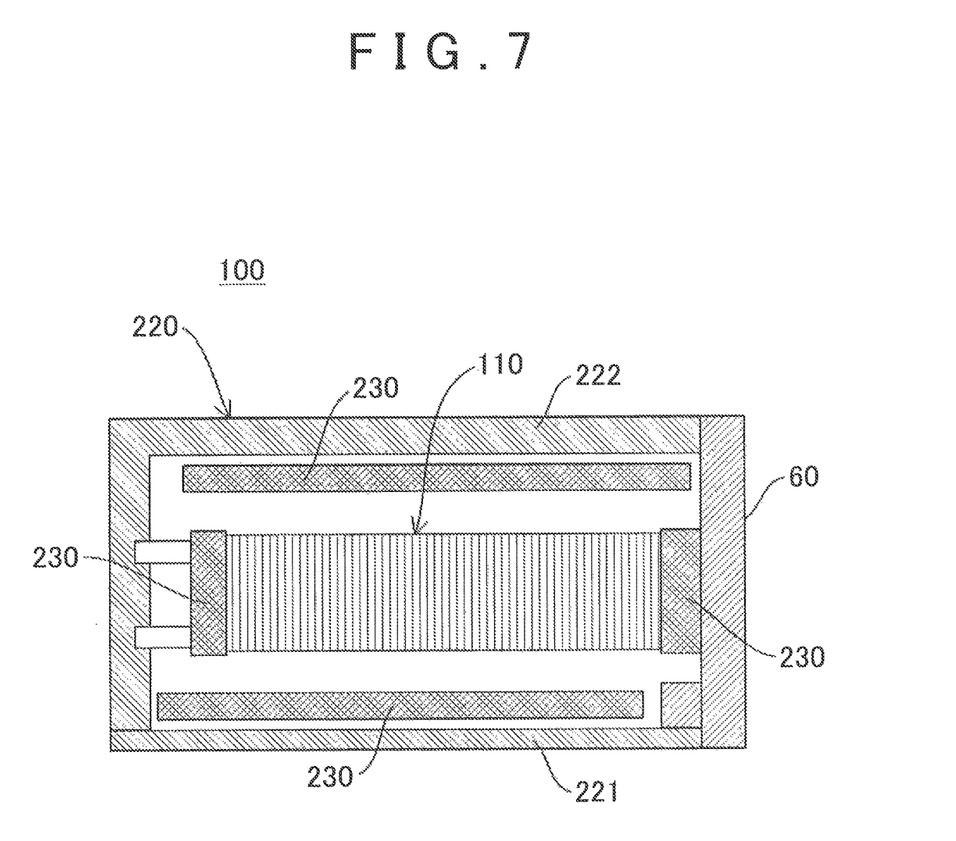
FIG. 7 is a cross-sectional view taken along VII-VII line in FIG. 6B.
Figure 8:
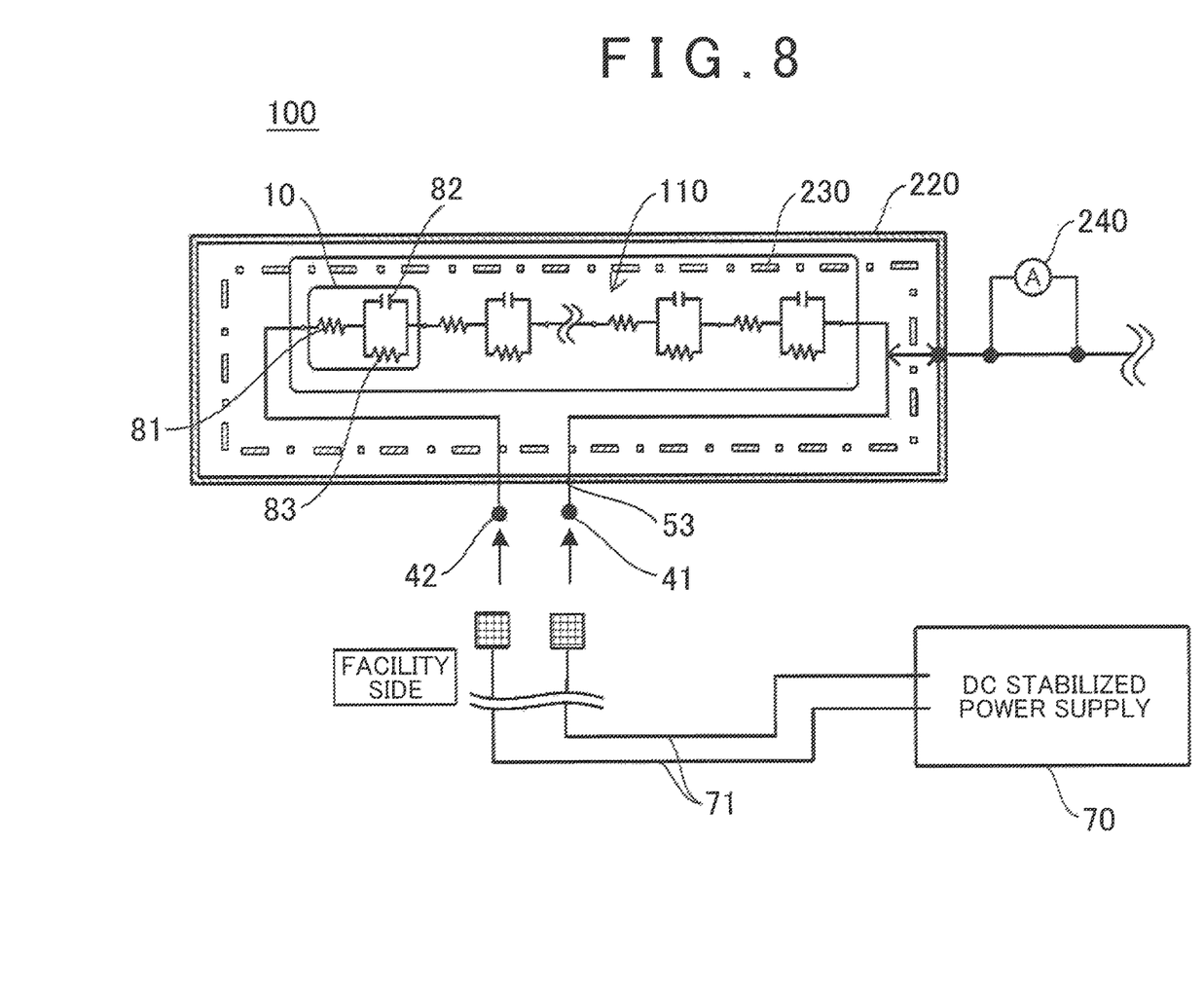
FIG. 8 is an explanatory view of one example of an electric insulation property inspection method of an exterior part in the second embodiment.
Figure 9:
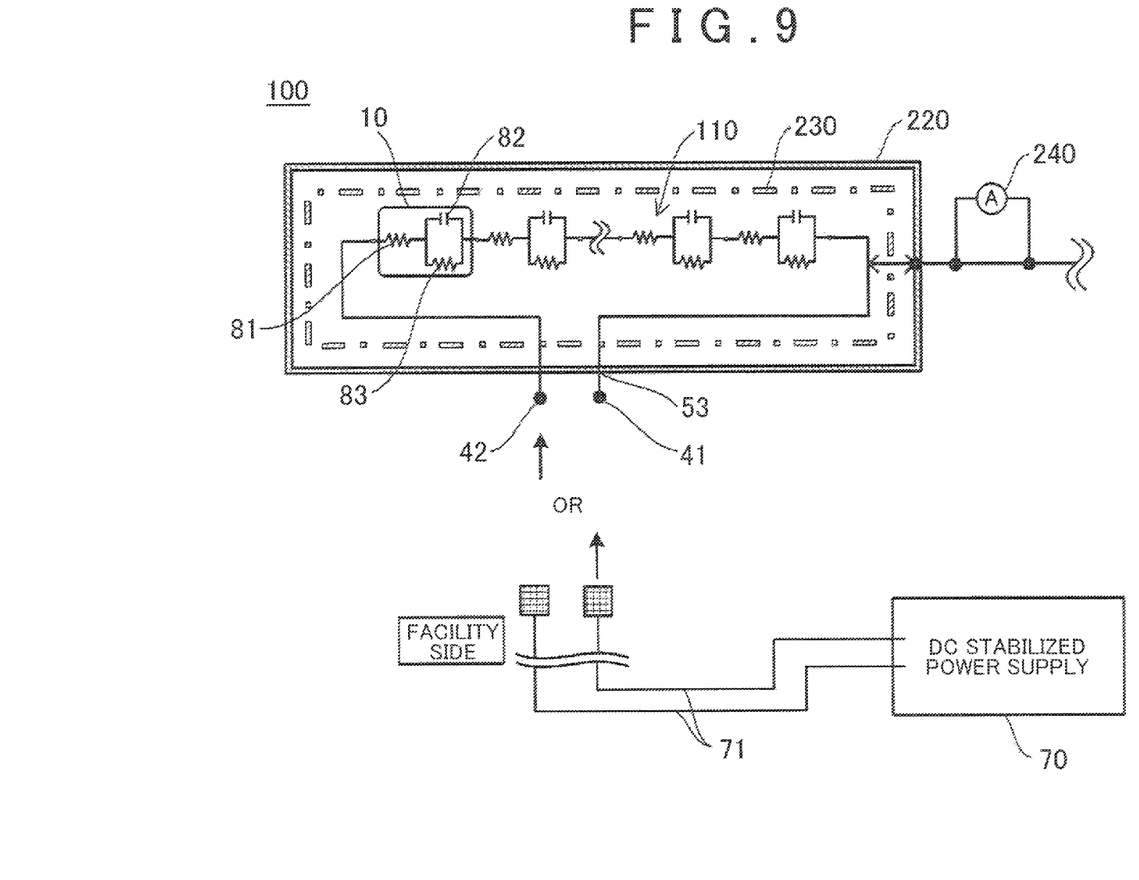
FIG. 9 is an explanatory view of another example of the electric insulation property inspection method of the exterior part in the second embodiment.

Next, a description will be made on an inspection method of an electric insulation property of an exterior part as an inspection method of a fuel battery according to a second embodiment of the invention with reference to FIG. 1 and FIG. 6A to FIG. 9. FIG. 6A and FIG. 6B is a schematic view of a fuel battery according to the second embodiment. FIG. 7 is a cross-sectional view taken along VII-VII line in FIG. 6B. FIG. 8 is an explanatory view of one example of the electric insulation property inspection method of the exterior part in the second embodiment. FIG. 9 is an explanatory view of another example of the electric insulation property inspection method of the exterior part in the second embodiment. It should be noted that the same components as those in the first embodiment will be described by being denoted by the same reference numerals.

Similar to the first embodiment, the inspection method of the electric insulation property of the exterior part in the second embodiment is conducted with the fuel battery 100 having the fuel battery stack 110 as the inspection target, and the external power supply (the DC stabilized power supply) 70 as the inspection facility (see FIG. 1). As shown in FIG. 6 and FIG. 7, the fuel battery stack 110 is accommodated in an exterior part 220 that is formed of a cover 221 in a flat plate shape and a casing 222 in a box shape. An opening of the exterior part 220 is closed by the end plate 61 that is provided at a longitudinal end of the fuel battery stack 110. As shown in FIG. 7, upper and lower sides, and left and right sides of the fuel battery stack 110 are covered with an electric insulation material 230.

In addition, as shown in FIG. 8 and FIG. 9, the each fuel battery cell 10 of the fuel battery stack 110 has the similar configuration to the first embodiment and includes the contact resistance 81, the electric double-layer capacity 82, and the electrical charge transfer resistance 83. Furthermore, an ammeter 240 for measuring a leak current leaked from the exterior part 220 is provided.

The inspection method of the electric insulation property of the exterior part of the second embodiment includes: a process of supplying the electrical charge from the external power supply to the fuel battery stack; and a process of inspecting the electric insulation property of the exterior part on the basis of the leak current from said exterior part after the process of supplying the electrical charge.

In the process of supplying the electrical charge from the external power supply to the fuel battery stack, as shown in FIG. 8, the connection cable 71 of the DC stabilized power supply 70 as the external power supply is electrically connected to the terminal board 53. Then, the electrical charge is supplied (the voltage is applied) from the DC stabilized power supply 70 to the fuel battery stack 110 so as to make the current flow through the fuel battery stack 110. The applied voltage from the DC stabilized power supply 70 to the fuel battery stack 110 is set at about 250 to 500 V, for example. It should be noted that, as shown in FIG. 9, the voltage may be applied to either the main-positive section 41 or the main-negative section 42 of the fuel battery stack 110.

Next, in the process of inspecting the electric insulation property of the exterior part, as shown in FIG. 8, the electric insulation property of the exterior part 220 is inspected on the basis of the leak current leaked from said exterior part 220 after the electrical charge supply process. The leak current leaked from the exterior part 220 is measured by the ammeter 240. By measuring the leak current from the exterior part 220, electric insulation resistance between the fuel battery stack 110 and the exterior part 220 can be measured without actually generating the electric power by supplying the fuel gas to the fuel battery stack 110.

In addition, as shown in FIG. 9, in the case where the voltage is applied to either the main-positive section 41 or the main-negative section 42 of the fuel battery stack 110, the electrical charges can be stored in the entire fuel battery stack 110 by using the leak current. In this way, an amount of the electrical charges that corresponds to the applied voltage can be stored in the fuel battery stack 110. Thus, the electric insulation resistance between the entire fuel battery stack 110 and the exterior part 220 can be measured without actually generating the electric power by supplying the fuel gas to the fuel battery stack 110.

In the inspection method of the fuel battery according to the second embodiment, a basically similar operational effect to the first embodiment is exhibited, that is, the inspection of the fuel battery stack 110 can be conducted without actually generating the electric power by supplying the fuel gas to the fuel battery stack 110 not only in the finished product of the fuel battery but also in the fuel battery in the manufacturing process. In particular, the inspection method of the electric insulation property of the exterior part in the second embodiment exhibits such an advantageous effect that the electric insulation resistance between the fuel battery stack 110 and the exterior part 220 can be measured without actually generating the electric power by supplying the fuel gas to the fuel battery stack 110. Furthermore, in the embodiment shown in FIG. 9, the electrical charge only needs to be applied to either the main-positive section 41 or the main-negative section 42 of the fuel battery stack 110. Thus, the measurement of the electric insulation resistance can be simplified.

The invention has been described by the embodiments as described above. It should not be understood that the description and the drawings that constitute a part of this disclosure limit the invention. From this disclosure, various modified embodiments, examples, and operational techniques should become apparent to those skilled in the art. It should also be understood that the invention includes various embodiments and the like that are not described herein.

What is claimed is:

1. An inspection method of a fuel battery including a fuel battery stack having a plurality of fuel battery cells, each fuel battery cell being connected to a cell monitor, the method comprising:
    a supplying step of supplying an electrical charge from an external power supply to the fuel battery stack; and
    a determining step of determining whether a connection between each of the fuel battery cells and the cell monitor is normal based on a value of the cell monitor after supplying the electrical charge,
    wherein the determining step is conducted before a fuel supply pipe and a fuel discharge pipe, in which fuel gas flows, are in communication with the fuel battery stack and in a state where both fuel gas is not supplied to the fuel battery cells and electric power is not generated via the fuel battery cells.

2. The inspection method of the fuel battery according to claim 1, wherein
    the fuel battery includes an main-positive section that is provided to a positive terminal of the fuel battery stack and an main-negative section that is provided to a negative terminal of the fuel battery stack, and
    the supplying step includes applying the electrical charge to either the main-positive section or the main-negative section.

3. The inspection method of the fuel battery according to claim 1, wherein
    the determining step is conducted before supplying devices that supply hydrogen gas and oxidation gas as fuel gas to the fuel battery are connected to the fuel battery stack.

4. The inspection method of the fuel battery according to claim 1, wherein
    the cell monitor is configured to detect a voltage of each of the fuel battery cells and to send a detected voltage to an inspection facility outside the fuel battery stack, the inspection facility being configured to perform the determining step.

5. The inspection method of the fuel battery according to claim 1 further comprising:
    a first detecting step of detecting, by the cell monitor, a voltage of each of the fuel battery cell before the supplying step; and
    a second detecting step of detecting, by the cell monitor, the voltage of each of the fuel battery cell after the supplying step, wherein
    the determining step is performed based on a difference between a voltage detected in the first detecting step and a voltage detected in the second detecting step.

6. The inspection method of the fuel battery according to claim 1, further comprising
    an inspecting step of inspecting an electric insulation property of an exterior part of the fuel battery stack based on a leak current from the exterior part after the electrical charge is supplied.

7. The inspection method of the fuel battery according to claim 1, wherein the external power supply is a DC stabilized power supply.

8. The inspection method of the fuel battery according to claim 1, wherein the determining step is conducted during a manufacturing process.

* * * * *